United States Patent
Ovtchinnikov et al.

(10) Patent No.: US 8,615,029 B2
(45) Date of Patent: Dec. 24, 2013

(54) OPTICAL DEVICE

(75) Inventors: Alexander Ovtchinnikov, Worcester, MA (US); Alexey Komissarov, Charlton, MA (US); Valentin P. Gapontsev, Worcester, MA (US); Pavel Trubenko, Worcester, MA (US)

(73) Assignee: IPG Photonics Corporation, Oxford, MA (US)

( * ) Notice: Subject to any disclaimer, the term of this patent is extended or adjusted under 35 U.S.C. 154(b) by 487 days.

(21) Appl. No.: 12/649,443

(22) Filed: Dec. 30, 2009

(65) Prior Publication Data

US 2011/0158274 A1 Jun. 30, 2011

(51) Int. Cl.
*H01S 3/06* (2006.01)

(52) U.S. Cl.
USPC ............................................. 372/66; 372/97

(58) Field of Classification Search
USPC ..................................................... 372/97, 66
See application file for complete search history.

(56) References Cited

U.S. PATENT DOCUMENTS

| | | | | |
|---|---|---|---|---|
| 4,689,797 A | * | 8/1987 | Olshansky | 372/45.01 |
| 5,442,723 A | | 8/1995 | Vinchant | |
| 5,555,544 A | * | 9/1996 | Walpole et al. | 372/50.1 |
| 5,592,503 A | * | 1/1997 | Welch et al. | 372/50.11 |
| 5,917,972 A | | 6/1999 | Davies | |
| 5,978,400 A | | 11/1999 | Campbell | |
| 5,985,685 A | | 11/1999 | Lealman | |
| 6,600,764 B1 | * | 7/2003 | Garbuzov et al. | 372/46.01 |
| 6,600,847 B2 | | 7/2003 | Saini | |
| 2002/0141467 A1 | * | 10/2002 | Iwai et al. | 372/45 |

\* cited by examiner

*Primary Examiner* — Kinam Park
(74) *Attorney, Agent, or Firm* — Yuri Kateshov; Timothy J. King

(57) ABSTRACT

A laser diode is configured with a substrate delimited by opposite AR and HR reflectors and a gain region. The gain region bridges the portions of the respective AR and HR reflectors and is configured with a main resonant cavity and at least one side resonant cavity. The main resonant cavity spans between the portions of the respective reflectors, and at least one additional resonant cavity extends adjacent to the main resonator cavity. The gain region is configured so that stimulated emission is generated only in the main resonant cavity. Accordingly, the laser diode is operative to radiate a high-power output beam emitted through the portion of the AR reflector which is dimensioned to shape the output beam with the desired near-field.

20 Claims, 5 Drawing Sheets

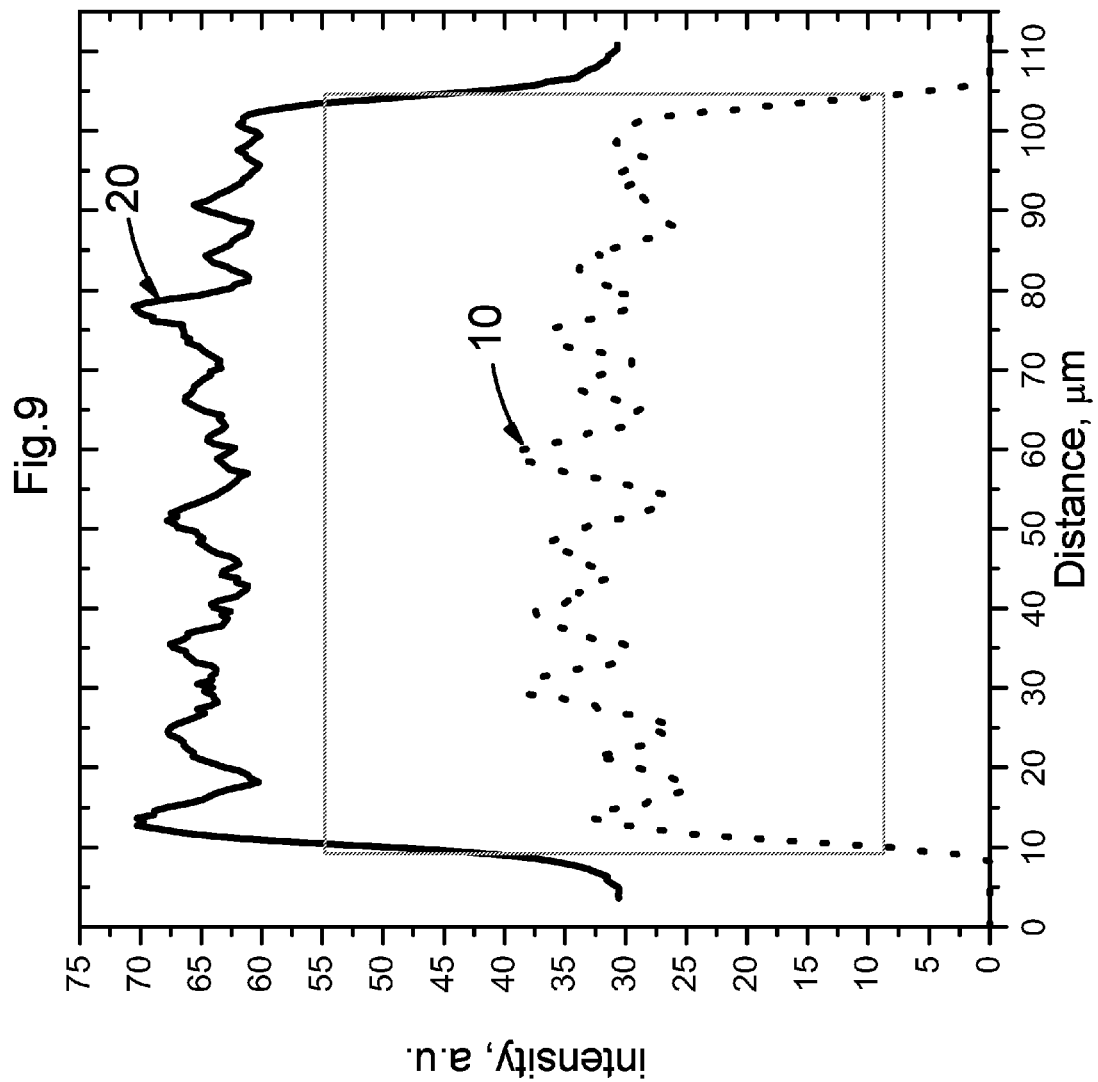

OPTICAL DEVICE

BACKGROUND OF THE DISCLOSURE

1. Field of the Disclosure

The disclosure relates to a striped semiconductor active optical device with uniformly or non-uniformly configured gain region. In particular, the disclosure relates to a semiconductor laser diode with a gain region configured to radiate a high power output radiation with the desired near field.

2. The Related Prior Art

FIG. 1 illustrates a typical structure of semiconductor laser diode 10. The laser diode includes a substrate 12 with an elongated stripe 14—uniformly-dimensioned gain region which coextends with substrate 12 between reflectors 16 and 18, respectively. The mirrors 16' and 18' of the respective reflectors define the resonator. In operation, stripe 14 is traversed by current and operative to emit an optical radiation from either of the mirrors, for example, mirror 18'. The method of fabricating laser diodes is disclosed in U.S. Pat. Nos. 5,917,972, 5,978,400 and 5,985,685, respectively, all co-owned with the present application by the same assignee and fully incorporated herein by reference. The output mirror 18', defining the near field of the output beam, is the subject to rigid requirements, i.e., its width W should not exceed a predetermined value. Otherwise, the emitted radiation would be coupled into a receiving component, such as fiber, with substantial power losses, The ever-increasing demands for high power optical outputs are associated with increased temperature and current loads upon the stripe, which would not be of any concern if mirror 18' was enlarged. However, as discussed above, it would be impractical. Accordingly, the stripe, experiencing high loads, is known for a relatively short useful life because elevated temperatures and high currents lead to the degradation of laser diode 10. In particular, the degradation depends on a pump current applied to gain region 14 and the heat generated in the latter. Accordingly, to combat the detrimental effect of the excessive heat, it is necessary to enlarge the area of diode 10.

The greater area may result from further elongation of laser diode 10. However, the greater length of diode 10 leads to substantial internal losses as known to an ordinary skilled worker. Accordingly, the greater the length, the greater the inner losses, the lower the effectiveness of diode 10. The diminishing effectiveness leads to greater heat generation and, by implication, shorter life cycles. The efforts directed at remedying the undesirable consequences of the increased length are translated in a cost-ineffective fabricating process.

In addition to the desired near-field of the output beam emitted in a single mode (SM) or multi-mode radiation, it is often necessary to have the desired far-field of the output beam. Otherwise, the output beam can be coupled into a waveguide such as fiber and the like, with substantial losses.

A need, therefore, exists for a high power laser diode capable of emitting the output beam with the desired near-field.

A further need exists for a high-power laser diode operative to controllably emit the output beam with the desired far-field.

SUMMARY OF THE DISCLOSURE

These needs are met by a laser diode configured in accordance with the disclosure. The disclosed high-power laser diode includes a substrate, spaced apart reflectors and a gain region traversed by pump current and extending between the reflectors. The gain region is configured so that stimulated emission is generated only in a relatively small part thereof which is dimensioned so that emitted radiation has the desired near-field.

According to one embodiment of disclosure, the gain region has a power supply section which is larger than that one of an end output section. Due to such a shape, the gain region is configured with main and at least one side resonator cavities (each further referred to as a "resonator"). The main resonator extends between the reflectors and has a uniformly dimensioned structure corresponding to the radial width of the end section. At least one side resonator extends along the power section of the gain region adjacent to the main resonator and, thus, terminates at a distance from at least one of the reflectors output reflector.

In accordance with one aspect of the embodiment, the resonators are configured so that a lasing threshold in the main resonator is substantially lower than that one of the side resonator. Otherwise, if the resonators were configured with a uniform threshold, stimulated emission generated in the side resonator would detrimentally affect the power and quality of the output beam emitted from the main resonator.

Thus, the gain region is configured so that stimulated emission is generated only in a uniformly dimensioned relatively narrow stripe or main resonator which is delimited by spaced mirrors. The output mirror has dimensions selected to provide the output beam with the desired near-field. The side resonators each have a length selected so that no stimulated emission is generated within these resonators while the main resonator may experience amplification of light. Thus, while the power handling characteristics of the disclosed diode are improved due to the overall enlarged area of the active region, the emitted radiation and particularly its near-field are not compromised by the presence of the side resonators.

In accordance with another aspect of the embodiment, the bottle-neck shaped laser diode is configured so as to radiate an output beam also having the desired far field. The far field is a function of taper angle of the frustoconical section of the diode which is associated with adiabatic expansion and/or compression of mode(s). Such an expansion helps prevent excitation of high order modes in case of a single mode output, or generation of additional high order lateral modes in case of a multimode structure. Furthermore, the adiabatic expansion/compression in multimode structures is characterized by a uniform output angle of all radiated modes which corresponds to a relatively narrow far field.

However, with a taper angle larger than a certain angle, additional modes, which are generated in addition to initial modes, are radiated at an output angle different from the angle at which the initial modes are radiated. Hence, the far field of radiation containing originally and anew generated modes will be greater than the far field of radiation containing only the original modes. Thus, decreasing or increasing taper angle during a fabrication process allows for controlling the far field of the laser radiation.

According to another embodiment of the disclosure, a laser diode is configured with a uniformly dimensioned gain region. At least one light blocking components is provided within the gain region so that stimulated emission is generated only in a relatively small portion—main resonator—of the gain region. The dimensions of the blocking component are such that the emitted radiation is characterized by the desired near filed.

BRIEF DESCRIPTION OF THE DRAWINGS

The above and other features of the disclosure will be discussed hereinbelow in conjunction with the following drawings:

FIG. 9 illustrates the near field of radiation emitted from the disclosed and prior art devices, respectively.

SPECIFIC DESCRIPTION

Figure 1:
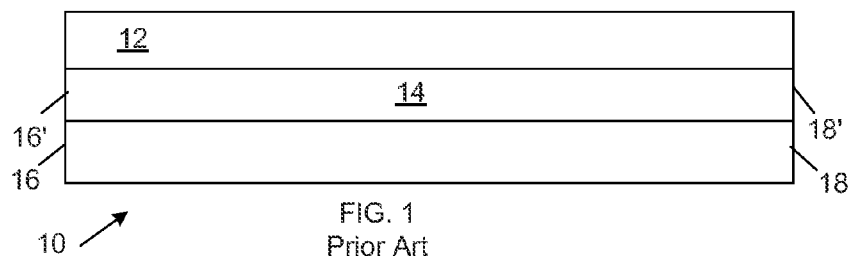
FIG. 1 is one of the known structures of an optical device with a striped configuration.

Reference will now be made in detail to the disclosed optical device. Wherever possible, same or similar reference numerals are used in the drawings and the description to refer to the same or like parts or steps. The drawings are in simplified form and are far from precise scale.

Figure 2:
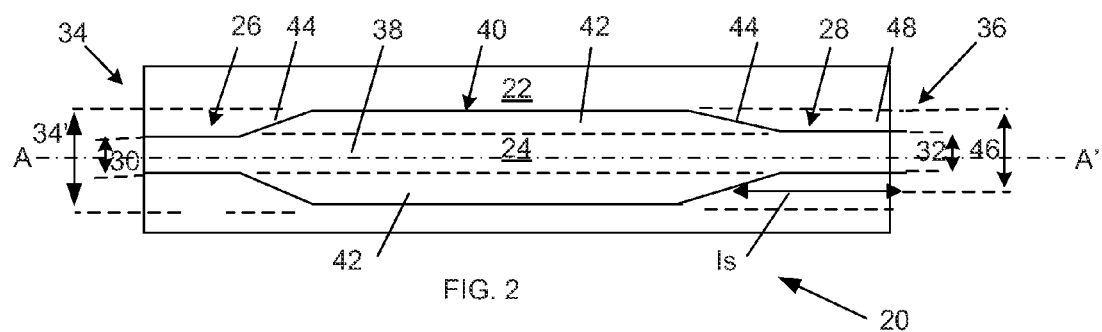
FIGS. 2-5 illustrate respective configurations of the disclosed optical device structured in accordance with one aspect of the disclosure.

Referring to FIG. 2, the disclosed optical device is configured as a semiconductor laser diode 20 having an elongated substrate 22 and gain region 24 which is formed in the substrate and extends along a longitudinal axis A-A'. The gain region 24 is structured with at least two side resonators: a main resonator 38 which extends between spaced mirrors or portions of respective reflectors 30 and 32 and a side resonator 42, which terminates at a distance from at least one of spaced reflectors 34' and 46. As explained below, diode 20 is configured so that stimulated emission is generated only in main resonator 38, and not in side resonators 42. As a consequence, light is emitted only through mirror or reflector's portion 32 which has dimensions defining the desired near-field. At the same time, since the area of gain region 24 is increased, the diode is characterized by improved power handling parameters preventing main resonator 38 from experiencing unacceptable thermal and current loads.

Two facets or reflectors—reflector 34 provided with a high reflection (HR) coating and output reflector 36 coated with an anti-reflection (AR) coating—define therebetween an axial length of diode 20. The mirrors or portions 30 and 32 of the respective HR and AR reflectors extend through the opposite ends of gain region 24 so as to define a resonant cavity with a Fabry-Pèrot geometry.

The mechanism of lasing is well known. Initially traversed by pump current, a gain region is characterized by a spontaneous emission of light. As light carriers—photons—cycle through the gain region between spaced mirrors, they are amplified (gain). Once the total gain exceeds insertion losses, such as internal and output losses, spontaneous emission reaches a lasing threshold and further turns into stimulated emission.

A lasing threshold—the lowest excitation level at which stimulated emission is radiated from AR output mirror 32 at a given wavelength—is reached in response to a predetermined pump current applied to gain region 24. The AR output mirror 32 and therefore a near field of laser radiation are subject to rigid geometrical limitations and should not exceed the predetermined width. Otherwise, enlarging mirror 32 beyond the desired geometry of mirror 32 would be associated with substantial coupling losses of radiation emitted from diode 20 and launched into a delivery fiber. A compromise between the desired geometry of reflector 32 and enlarged overall area of gain region 24 is reached by non-uniformly dimensioned gain region 24, as discussed herein below.

The gain region 24, thus, includes opposite axially spaced end sections 26, 28, respectively, intermediate power supply section 40 and frustoconical sections 44. The latter bridge the opposite ends of power supply section 40 and respective end sections 26, 28 so as to provide propagation of single or multiple lateral modes substantially without inter-mode coupling and/or losses.

The configuration of gain region 24, thus, can be considered as having main resonator or stripe 38, which is traversed by light carriers circulating between mirrors 30 and 32, and one or more side resonators 42 depending on cross-section of gain region 24. The side resonators 42 can provide gain for photons traveling between reflector portions 34' and 46 through substrate regions 48 which flank respective resonators 42.

The length of power supply section 40 is controllably selected to prevent the generation of stimulated emission in side resonator or resonators 42. This is accomplished by having the length of each side resonator 42 configured so that light carriers, which are coupled out of resonator 42, are absorbed or dispersed on a way to and from reflector portion 46 along path Is. In other words, the dimension of side resonator 42 is such that there is practically no circulation of photons between reflectors 34' and 46. Accordingly, while light in main resonator 38 experiences gain due to the circulation of photons through gain medium between mirrors 30 and 32, side resonators 42 are characterized only by weak spontaneous emission. Thus power supply section 40 of gain region 24 is configured with such an axial length that light traveling through the gain medium of side resonators 42 would not have a gain due to its substantial losses in high loss substrate regions 48. This, of course, means that the lasing threshold in main resonator 38 is considerably lower than that one of side resonator 42 which may never have the conditions necessary for stimulated emission which, otherwise, would detrimentally affect the desired output radiation. But for the structure disclosed above, gain region 24 would emit radiation at the desired wavelength through reflector portion 46 with the desired near filed which has its radial dimension substantially equal to that one of power supply section 40 and, thus, is greater than the desired geometry of AR mirror 32.

As a result, only the desired portion—AR mirror 32—of output reflector 36 emits radiation which can be coupled into a receiving waveguide, such as fiber (not shown), without substantial losses. Furthermore, power section 40 allows for lower power density and overall lower current loads on laser diode 20. Thus, the disclosed configuration of gain region 24 has the desired geometry of AR reflector 32, overall length of diode 20 and low thermal and current loads on diode 20. The latter translates into a long lifetime of diode 20.

The length of power supply section 40 and, therefore, side resonators 42, is a function of many variables, as known to one of ordinary skills in the laser art. Given only as an example, the variables affecting the length of the power supply section may include, among others, an AR coating, number of quantum wells, depth of mesa, i.e., the region receiving pump current and others. The desired length of power supply section 40 may be established empirically by continuously comparing the near field of a laser diode which has a uniformly dimensioned gain region with the diode as disclosed. For example, FIG. 9 illustrates the respective near fields of radiation emitted by the disclosed diodes and known diode 10 of FIG. 1. One can easily see that the near fields of respective diodes 10 of FIGS. 1 and 20 of FIG. 2 are substantially the same. If the near field of disclosed laser diode 20 is substantially differed from that one of diode 10, the fabrication process will continue until the desired near field is obtained.

Figure 3:
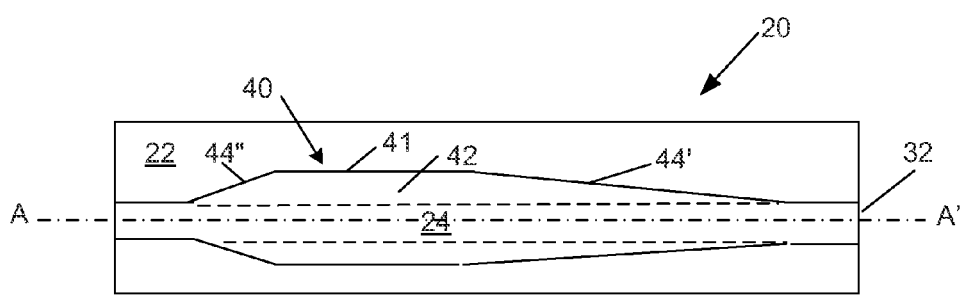
Figure 4:
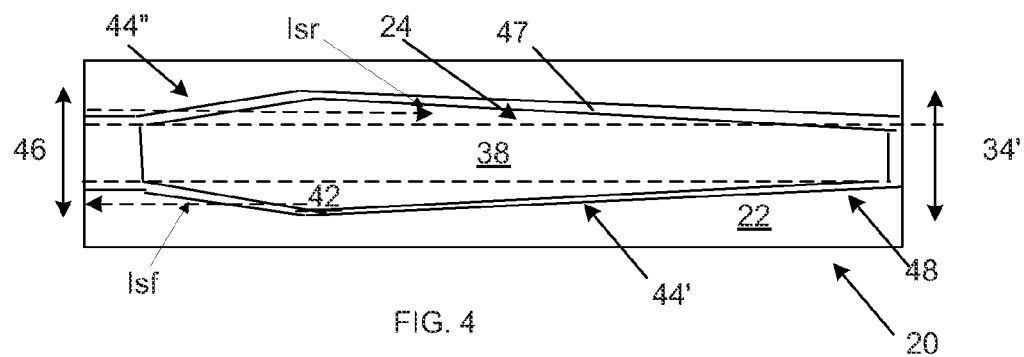

FIGS. 3 and 4 illustrate respective geometrical modifications of laser diode 20 which, as disclosed above, is configured with at least one side Fabry-Perot resonator. In particular FIG. 3, in contrast to the modification of FIG. 2, shows diode 20 having end regions output tapering section 44' of gain region 24 having an axial length different from that one of input tapering section 44". In addition, midsection 40 is somewhat shorter than that one of FIG. 2 and has an irregular shape, i.e., its longitudinal sides 41 extend at an angle to the axis A-A'. Otherwise, the cross-section of stripe 24 in both FIGS. 2 and 3 may be generally described as a double bottleneck-shaped cross-section.

FIG. 4 illustrates laser diode 20 which has a power supply section configured only with input and output tapering sections 44" and 44', respectively, which define a ridge region corresponding to side resonators 42. The photons providing for spontaneous emission in resonator 42 may couple out therefrom and travel along light path 1sf on a way to the opposite reflectors. A large portion of the photons is absorbed in substrate high loss region 48 before reaching one of reflectors, for example, reflector 46. The reflected photons travel back along path lsr through the same high loss region 48, and, again, a large portion of them is absorbed. As a consequence, if any photons still reach resonator 42, their number is not nearly enough to create lasing conditions after traveling further through another high-loss substrate region to and from HR resonator 34'. Hence this configuration of diode 20, like those above, is characterized by enhanced power handling capabilities and lower thermal and current loads, but the desired near-filed of the output beam. To further decrease current loads, a mesa is provided so that its border 47 extends complementary to, but spaced inwards from the outer boundary of gain region 24.

Figure 5:
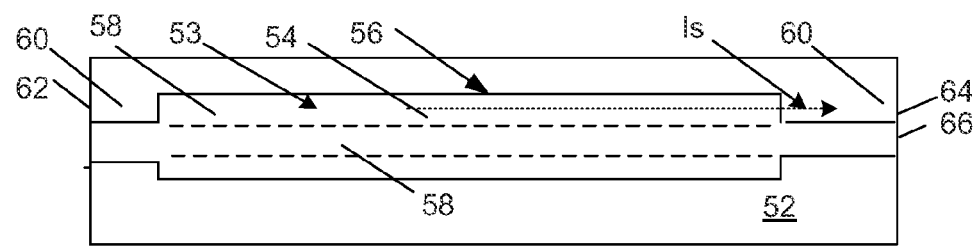

FIG. 5 illustrates a further aspect of disclosed laser diode 50 based, however, on the same concept as diode 20 of FIGS. 2-4. Particularly, a gain region 53 formed on substrate 52, has an enlarged midsection 56 configured so that a main Fabry-Perot resonator 58 is adjacent to at least one or more side resonators 54. The side resonators 54, like resonators 42 of FIGS. 2-4, are subject to the length limitation and configured with a lasing threshold which is substantially higher than that one of main resonator 58. Accordingly, absorbent regions 60 are configured along a photon path Is between side resonators 54 and opposite reflectors 62 and 64. Accordingly, compared to the previously disclosed embodiments, gain region 53 has the greater overall area and, thus, smaller thermal and current loads on a portion or mirror 66 of output reflector 64.

Figure 6:
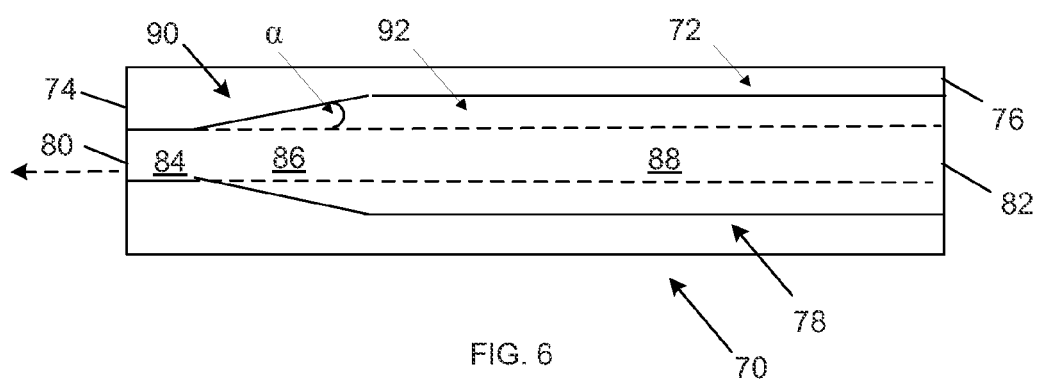
FIG. 6 illustrates the disclosed optical device configured in accordance with a further aspect of the disclosure which relates to a controllable far-field of the diode's output beam.

Turning to FIG. 6, a laser diode 70, like diodes 20 and 50, is configured with a substrate 72 extending between opposite reflectors 74 and 76, respectively, and a gain region 78 provided in the substrate between AR and HR mirrors 80 and 82, respectively. The gain region 78 is configured with three sections including an end section 84, frustoconical section 86 and power supply section 88. Also, laser diode 70 is configured with a high-loss substrate region 90 extending between AR reflector 74 and side resonator or resonators 92 and operative to absorb and/or disperse carrier photons which constitute spontaneous emission in side resonators 92. The length of enlarged power supply section 88 is configured to prevent generation of stimulated emission in side resonators 92, as disclosed below.

The photons generating a spontaneous emission in side resonator 92 may impinge on HR reflector 76, travel back to and couple out from resonator 92 so as to traverse high-loss region 90 and eventually bounce from the opposite reflector into resonator 92. Such a cycle may lead to the generation of undesirable stimulated emission in additional side resonators 92. However, as explained above, the length of power supply section 88 is so selected that a large portion of photons is absorbed on a way to and from reflector 74. Consequently the majority of photons is prevented from returning to additional resonator 92, and the quantity of those photons that manage to return is not sufficient for generating stimulated emission.

According to a further aspect of the disclosure, laser diode 70, like diodes 20 and 50, has a configuration characterized by the desired far field or divergence of laser radiation. The far field is a function of the taper angle of frustoconical section 86. At a certain taper angle, modes, initially originated in gain region 78, are compressed along frustoconical section 86 in an adiabatic manner if section 86 is configured with a predetermined taper angle $\alpha$. As a consequence, the output beam radiated from reflector 74 has a certain far-filed. However, once a taper angle exceeds angle $\alpha$, other modes are generated and amplified in gain region 78. The newly generated modes are emitted at an angle different from the angle at which the initial modes are radiated. In fact, the angle of radiation of newly generated modes will be greater than the angle of radiation of the original modes. Hence, the far field of radiation containing originally and anew generated modes will be greater than the far field of radiation containing only the original modes. Thus, by decreasing or increasing the taper angle, it is possible to control the far field of the laser radiation. Note that the embodiments of FIGS. 2-5 each can be configured to radiate the output beam with the desired far field.

Figure 6A:
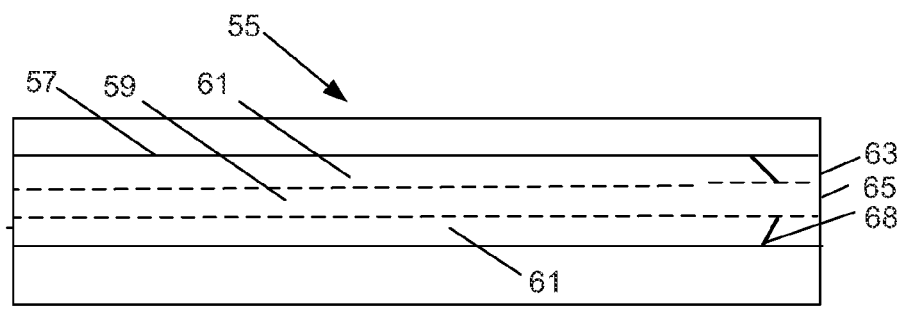
FIG. 6A illustrates a further configuration of the disclosed optical device providing for the desire near filed of the output beam.

FIG. 6A illustrates a further modification of laser diode 55 configured with the desired near field. In contrast to all of the above-discussed embodiments, diode 55 includes a uniformly dimensioned gain region 57. However, similarly to all of the above-disclosed embodiments, gain region 57 has a main resonator 59 and at least one or more side resonators 61. The segmentation of gain region 57 is realized by means of blocking components such as grooves or other defects 68 provided within the side resonator 61. The blocking components 68 are configured so that the majority of light passing along side resonator 61 is prevented from impinging upon an AR reflector 63. Although the blocking element 68 is shown located close to AR reflector 63, the number and locations of blocking components are the matter of design, as long as stimulated emission is generated only in main resonator 59. In other words, the lasing threshold of main resonator 59 is substantially lower that that one of side resonators 61. Accordingly, one or more side resonators 61 have such a lateral width that main resonator 59 and, thus, a portion 65 of output AR reflector 63 are dimensioned to provide for the desired near field of the output beam.

Figure 7:
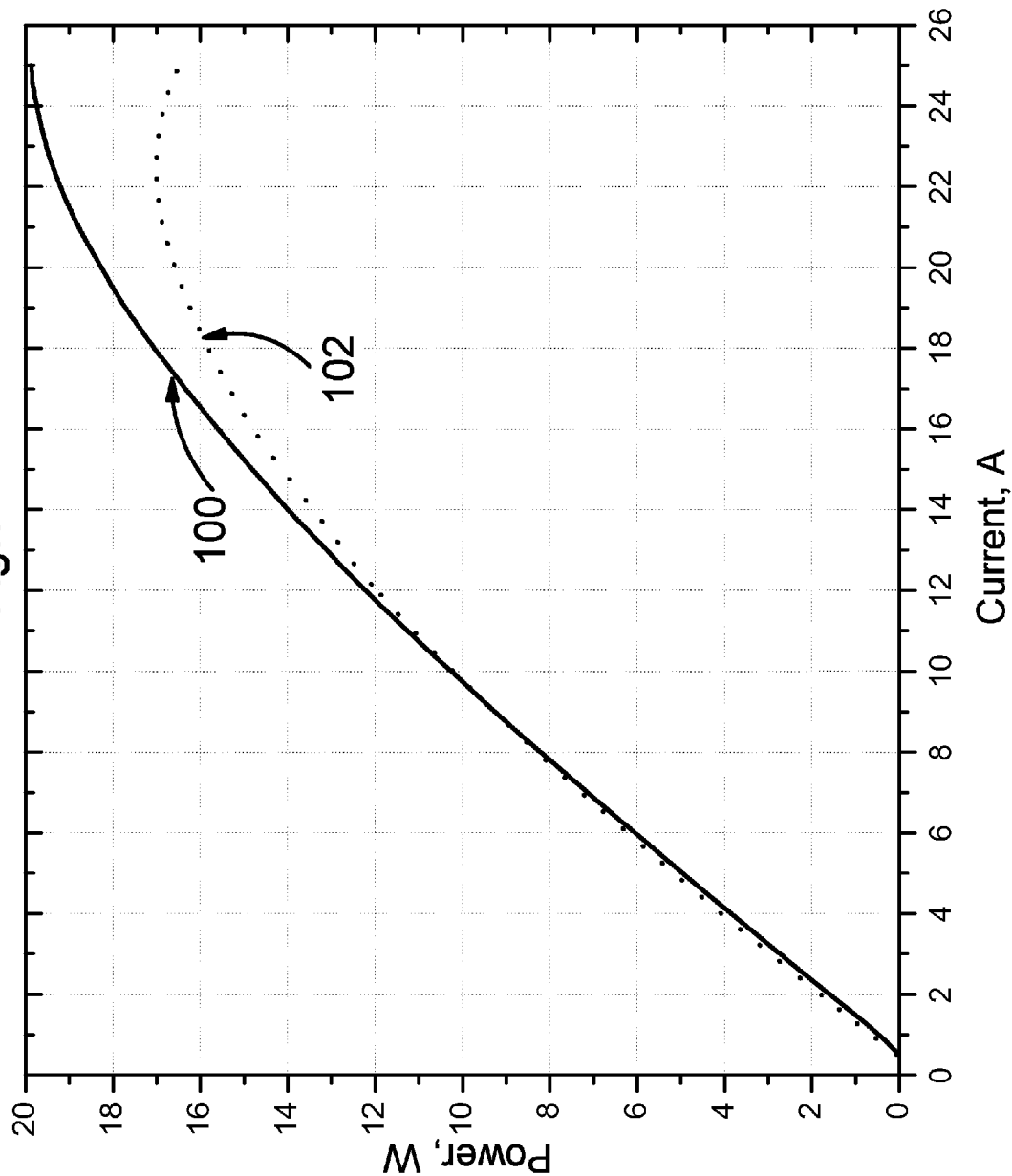
FIG. 7 illustrates the relationship between the power of emitted radiation and pump current in the disclosed and prior art optical devices, respectively.
Figure 8:
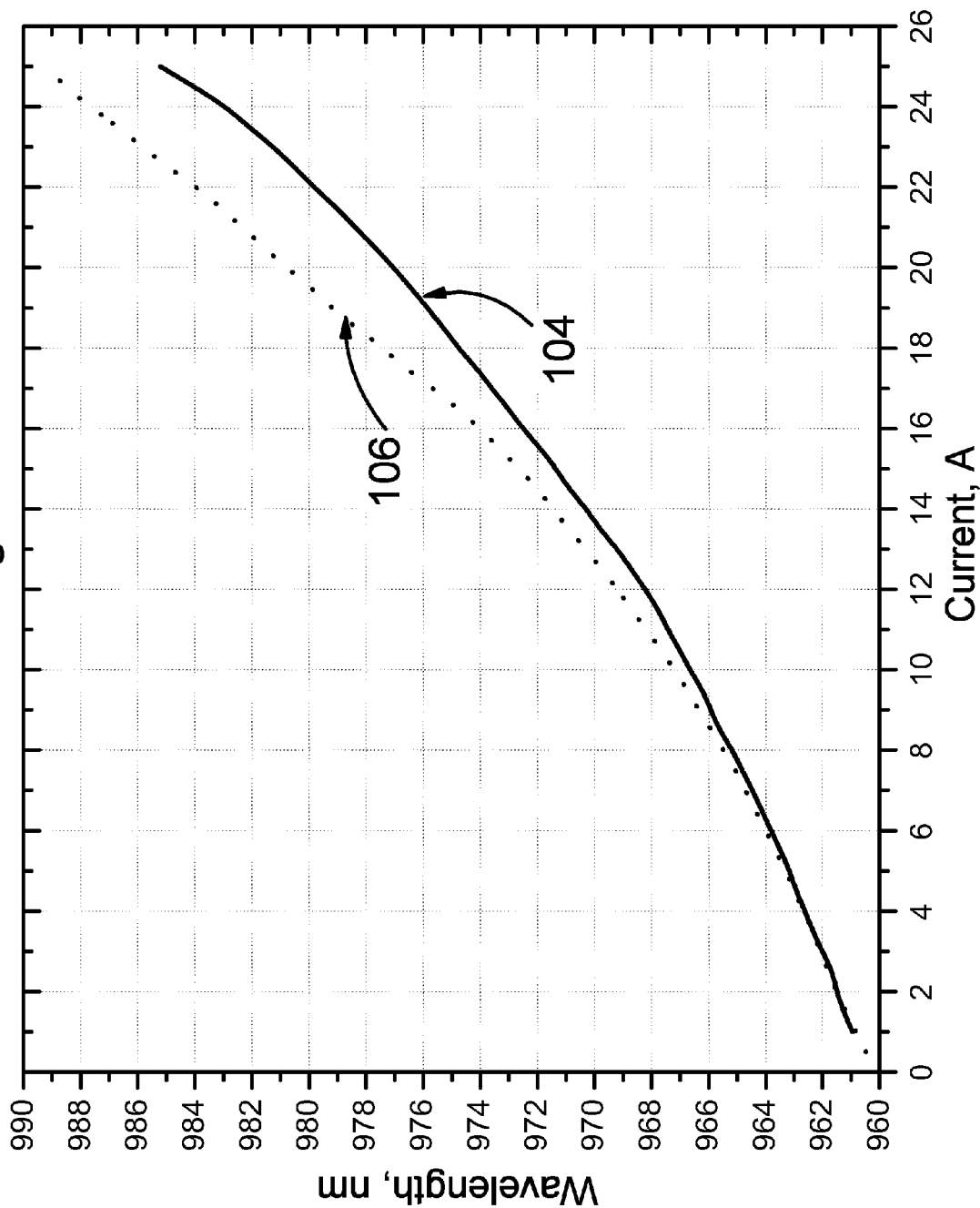
FIG. 8 illustrates the relationship between the wavelength of the emitted radiation and the pump current in the disclosed and prior art devices, respectively.

FIGS. 7 and 8 each illustrate data confirming the above-discussed advantages of disclosed laser diodes over the known prior art configurations. As can be seen in FIG. 7, particularly at high currents, a curve 100 representing the dependence of output power W from pumped current A in the disclosed configurations has a smoother slope than a slope of curve 102 representing the known striped configuration. In other words, the disclosed laser diode is characterized by highly effective heat removal; the more effective the heat removal, the higher the output power. FIG. 8 illustrates the dependence of wavelength from pump current A. As known to one of ordinary skill in the semiconductor laser arts, as temperatures in a laser diode rise, the radiation tends to be emitted at longer wavelengths. Accordingly, curves 104 and 106, which represent respective disclosed and known laser diode configurations, respectively, show that at the same pump current the radiation of the disclosed diode is generated at a wavelength shorter than a wavelength of known configuration. As a consequence, the thermal loads of the disclosed diode are smaller than those of the prior art structures.

Although the disclosure has been illustrated and described in specific detail and structure of operations it is clearly understood that the same were for purposes of illustration and that changes and modifications may be made readily therein by those skilled in the art without departing of the spirit and the scope of this invention.

The invention claimed is:

1. A multimode ("MM") laser diode, comprising:
a substrate extending between spaced HR and AR reflectors;
a gain region provided in the substrate and operative to emit radiation in multiple lateral modes radiation at a desired wavelength, the gain region having:
a main resonator bridging portions of the respective HR and AR reflectors, and
a side resonator located adjacent to the main resonator and configured with a lasing threshold higher than a lasing threshold of the main resonator, wherein the multimode radiation is emitted through the portion of the AR reflector with a desired near field.

2. The MM laser diode of claim 1, wherein the side resonator is separated from the AR reflector by a substrate area, the side resonator being configured with a length selected so that a lasing threshold of the main resonator is lower than that one of the side resonator.

3. The MM laser diode of claim 2, wherein the gain region is configured with a power supply section terminating at a distance from the portion of the AR reflector, the power supply section having a length substantially equal to the length of the side resonator and a radial width greater than a radial width of the portion of the AR reflector, the main resonator being uniformly dimensioned with a radial width substantially equal to the radial width of the portion of the AR reflector.

4. The MM laser diode of claim 3, wherein the gain region has an end section terminating in a plane of the portion of the AR reflector, which determines the desired near-field of the output laser beam, and having the radial width of the portion of the AR reflector.

5. The MM laser diode of claim 4, wherein the gain region further includes a frustoconical section bridging the end and power supply sections so that the main resonator, extending between the portions of the respective AR and HR reflectors, is sandwiched between two side resonators.

6. The MM laser diode of claim 5, wherein the frustoconical section is configured with a taper angle selected so as to provide the output laser beam with a desired far-field.

7. The MM laser diode of claim 6, wherein the gain region is further configured with additional end and frustoconical sections extending between the portion of the HR reflector and the supply section.

8. The MM laser diode of claim 3, wherein the power supply section has two frustoconical sections diverging inwards from the respective portions of the AR and HR reflectors and meeting one another between the AR and HR.

9. The MM laser diode of claim 4, wherein the gain region further has an additional end section, the end sections being directly bridged by the power supply section, the end and power supply sections each having substantially a rectangular cross-section.

10. The MM laser diode of claim 3, wherein the power supply section of the gain region has a width selected from the group consisting of a uniform width and non-uniform width.

11. The MM laser diode of claim 1, wherein the gain region includes a power supply section bridging the portions of the respective AR and HR reflectors and configured with the main and side resonators, a light blocking component provided in the side resonator at a distance from one of the portions of the respective HR and AR reflectors and configured to prevent generation of stimulated emission in the side resonator.

12. A multimode ("MM") laser diode comprising:
a substrate extending along an axis between an AR reflector and an HR reflector;
a gain region provided in the substrate and including adjacent main and side resonators which extend between spaced HR and AR reflectors and are configured so that stimulated emission is generated only in the main resonator and emitted through a portion of the AR reflector in multiple lateral modes with a desired near field at a desired wavelength.

13. The MM laser diode of claim 12, wherein the gain region is configured with: an end section extending axially from the AR reflector towards the HR reflector, a frustoconical section extending axially from the end section and expanding axially towards the HR reflector, and a power supply section extending axially from the frustoconical section towards the HR reflector and having a lateral dimension greater than that one of the end section.

14. The MM laser diode of claim 13, wherein the main resonator has a rectangularly-shaped cross-section and bridges portions of respective AR and HR thereby extending through the sections of the gain region, the side resonator extending along the power section and having an axial length selected so that a lasing threshold in the side resonator is substantially higher than a lasing threshold in the main resonator.

15. The MM laser diode of claim 14, wherein the gain region has two side resonators sandwiching the main resonator along the power supply section.

16. The MM laser diode of claim 13, wherein the frustoconical section is configured with a taper angle selected so as to provide the radiation with a desired far-field.

17. The MM laser diode of claim 13, wherein the gain region is further configured with additional end and frustoconical sections extending between a portion of the HR reflector and the power supply section.

18. The MM laser diode of claim 12, wherein the main and side resonators coextend with one another and bridge the AR and HR reflectors, the side resonator being provided with a light blocking component configured to prevent generation of stimulated emission therein.

19. The MM laser diode of claim 14, wherein the power supply section terminates in a plane of the HR reflector.

20. The MM laser diode of claim 12, wherein the gain region includes a power supply section bridging portions of respective AR and HR reflectors and configured with a region which is spaced from the AR and HR reflectors and has a cross-section larger than a cross-section of the rest of the power supply section, the main resonator having a rectangularly-shaped cross-section and extending through the power supply section between the portions of the respective reflectors, the additional resonator extending within the region of the power supply section.

* * * * *